(12) United States Patent
Yoshiike

(10) Patent No.: US 10,173,891 B2
(45) Date of Patent: Jan. 8, 2019

(54) MEMS DEVICE, LIQUID EJECTING HEAD, AND LIQUID EJECTING APPARATUS

(71) Applicant: SEIKO EPSON CORPORATION, Tokyo (JP)

(72) Inventor: Masashi Yoshiike, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/698,478

(22) Filed: Sep. 7, 2017

(65) Prior Publication Data

US 2018/0079641 A1 Mar. 22, 2018

(30) Foreign Application Priority Data

Sep. 21, 2016 (JP) ................. 2016-183925

(51) Int. Cl.
| | |
|---|---|
| *B81B 7/00* | (2006.01) |
| *B41J 2/14* | (2006.01) |
| *B41J 2/16* | (2006.01) |
| *B81C 1/00* | (2006.01) |

(52) U.S. Cl.
CPC ........... *B81B 7/007* (2013.01); *B41J 2/14201* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1643* (2013.01); *B41J 2/1646* (2013.01); *B81C 1/00301* (2013.01); *B41J 2002/14491* (2013.01); *B81B 2201/052* (2013.01); *B81B 2207/07* (2013.01); *B81C 2201/013* (2013.01)

(58) Field of Classification Search
CPC .................. B41J 2/14233; B41J 2002/14491
See application file for complete search history.

(56) References Cited

U.S. PATENT DOCUMENTS

| | | | |
|---|---|---|---|
| 2002/0030245 A1* | 3/2002 | Hanaoka | ................. H01L 24/11 257/621 |
| 2006/0288572 A1* | 12/2006 | Tanaka | .................... H01L 24/11 29/846 |
| 2014/0092167 A1* | 4/2014 | Nishi | ................... B41J 2/14233 347/20 |
| 2017/0050437 A1 | 2/2017 | Yoshiike | |
| 2017/0217177 A1* | 8/2017 | Takabe | ................. B41J 2/14233 |

FOREIGN PATENT DOCUMENTS

| | | |
|---|---|---|
| JP | 08-181242 | 7/1996 |
| JP | 2017-41583 | 2/2017 |

\* cited by examiner

*Primary Examiner* — Shelby L Fidler
(74) *Attorney, Agent, or Firm* — Workman Nydegger

(57) ABSTRACT

There is provided a MEMS device which includes a second substrate which is disposed with an interval from a first substrate, and an interposed member which is interposed between the first substrate and the second substrate, and which has space which is defined by the first substrate, the second substrate, and the interposed member, in which the first substrate includes a wiring which extends from a first surface side which is a surface on a side opposite to the second substrate toward a second surface side which is a surface of the second substrate side and is made of a conductor, in which an end portion of the first surface side of the wiring is covered by a first protective film provided on the first surface side, and in which an end portion of the second surface side of the wiring faces the space.

4 Claims, 5 Drawing Sheets

MEMS DEVICE, LIQUID EJECTING HEAD, AND LIQUID EJECTING APPARATUS

BACKGROUND

1. Technical Field

The present invention relates to a MEMS device in which space is formed between two bonded substrates, a liquid ejecting head, and a liquid ejecting apparatus.

2. Related Art

A micro electro mechanical systems (MEMS) device which includes two substrates and has space between these two substrates is applied to various apparatus (for example, liquid ejecting apparatus, sensor, or the like). For example, in a liquid ejecting head which is a type of MEMS device, an actuator such as a piezoelectric element is provided in the space described above. In addition, as the liquid ejecting apparatus on which such a liquid ejecting head is mounted, for example, there is an image recording apparatus such as an ink jet type printer and an ink jet type plotter. Recently, the liquid ejecting apparatus having a feature that a very small amount of liquid can be accurately landed to a predetermined position is developed and then is also applied to various manufacturing apparatus. For example, the liquid ejecting apparatus is applied to a display manufacturing apparatus for manufacturing a color filter such as a liquid crystal display, an electrode forming apparatus for forming an electrode such as an organic electro luminescence (EL) display and a face emitting display (FED), and a chip manufacturing apparatus for manufacturing a biochip (biochemical element). Liquid ink is ejected from a recording head for the image recording apparatus and a solution of each color material of red (R), green (G), and blue (B) is ejected from a color material ejecting head for the display manufacturing apparatus. In addition, a liquid electrode material is ejected from an electrode material ejecting head for the electrode forming apparatus, and a solution of a biological organic material is ejected from a biological material ejecting head for the chip manufacturing apparatus.

As the MEMS device described above, there is a MEMS device which is provided with a wiring (hereinafter, also referred to as through wiring) passing through one of the two substrates in a plate thickness direction thereon. Meanwhile, without being limited to the through wiring of the MEMS device, the wiring formed on a substrate or the like is covered with a protective film for suppressing corrosion (see, for example, JP-A-8-181242). In particular, in a substrate having a through wiring, since both end portions of the through wiring (end portion on upper surface side of substrate and end portion on lower surface side of substrate) are exposed, the protective film is formed on both surfaces of the substrate in order to cover the both end portions of the through wiring as disclosed in JP-A-8-181242.

Here, it is preferable that the thickness of the protective film be reduced (that is, film thinning) from the viewpoint of improving the productivity and suppressing the manufacturing cost thereof. In particular, in a case where a metal having conductivity and corrosion resistance is used for the protective film so as to make the protective film function as a portion of the wiring, the manufacturing cost thereof tends to increase. In other words, metals having conductivity and corrosion resistance often include rare metals such as titanium (Ti) and tungsten (W), and thus the manufacturing cost is likely to be increased. Therefore, it is further preferable that the thickness of the protective film be decreased.

SUMMARY

An advantage of some aspects of the invention is to provide a MEMS device, a liquid ejecting head, and a liquid ejecting apparatus which can reduce a thickness of a protective film and reduce manufacturing cost thereof.

According to an aspect of the invention, there is provided a MEMS device which includes a first substrate; a second substrate which is disposed with an interval from the first substrate; and a interposed member which is interposed between the first substrate and the second substrate, and which has space which is defined by the first substrate, the second substrate, and the interposed member, in which the first substrate includes a wiring which extends from a first surface side which is a surface on a side opposite to the second substrate side toward a second surface side which is a surface of the second substrate side and is made of a conductor, in which an end portion of the first surface side of the wiring is covered by a first protective film provided on the first surface side, and in which an end portion of the second surface side of the wiring faces the space.

According to the configuration, since the end portion of the second surface side of the wiring faces the space, the end portion of the second surface side of the wiring is unlikely to be influenced by the environment outside the first substrate and the second substrate. Accordingly, the end portion of the second surface side of the wiring is unlikely to be corroded and the protective film covering the end portion of the second surface side of the wiring can be thinned. Alternatively, the protective film covering the end portion of the second surface side of the wiring can be eliminated. As a result, the manufacturing cost of the MEMS device can be reduced. In addition, the time for forming the protective film can be shortened, and the productivity of the MEMS device can be improved.

In addition, in the configuration, it is preferable that the end portion of the second surface side of the wiring be covered by a second protective film provided on the second surface side, and a film thickness of the second protective film be thinner than that of the first protective film.

According to the configuration, the manufacturing cost of the MEMS device can be reduced and the productivity of the MEMS device can be improved. In addition, as compared with a case where the end portion of the second surface side of the wiring is not covered with the protective film, corrosion resistance of the wiring can be improved.

Further, in the configuration, it is preferable that the second protective film have conductivity, a protrusion portion which protrudes from the second surface and is made of resin be formed, the second protective film extend from a position covering the end portion of the second surface side of the wiring to a position overlapping the projection portion, and the protrusion portion be connected to a terminal formed on the second substrate with the protective film interposed between the protrusion portion and the terminal.

According to the configuration, the second protective film can function as a bump electrode which is connected to the terminal. Since the film thickness of the second protective film is formed to be thinner than that of the first protective film, when the bump electrode is pressed against the terminal to be electrically connected, cracking and fracturing is unlikely to be generated in the second protective film. As a result, reliability of the connection between the second protective film serving as the bump electrode and the terminal can be increased.

In addition, in the configuration, it is preferable that the protrusion portion include a first resin surface which is a surface along the second surface, and a second resin surface which is a surface provided so as to intersect the second surface and an inner angle at an intersection point between the first resin surface of the protrusion portion and the second resin surface of the protrusion portion be 90 degrees or less in the extending direction of the second protective film.

According to the configuration, disconnection between the second protective film extending from the second surface of the first substrate to the position overlapping the protrusion portion can be suppressed at a boundary between the second surface and the protrusion portion.

According to another aspect of the invention, there is provided a liquid ejecting head which includes a nozzle for ejecting liquid, the liquid ejecting head including: a structure of the MEMS device of any one of the above configurations.

According to the configuration, the manufacturing cost of the liquid ejecting head can be reduced and the productivity of the liquid ejecting head can be improved.

In addition, according to still another aspect of the invention, there is provided a liquid ejecting apparatus, including: the liquid ejecting head of the above configuration.

According to the configuration, the manufacturing cost of the liquid ejecting apparatus can be reduced, and the productivity of the liquid ejecting apparatus can be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
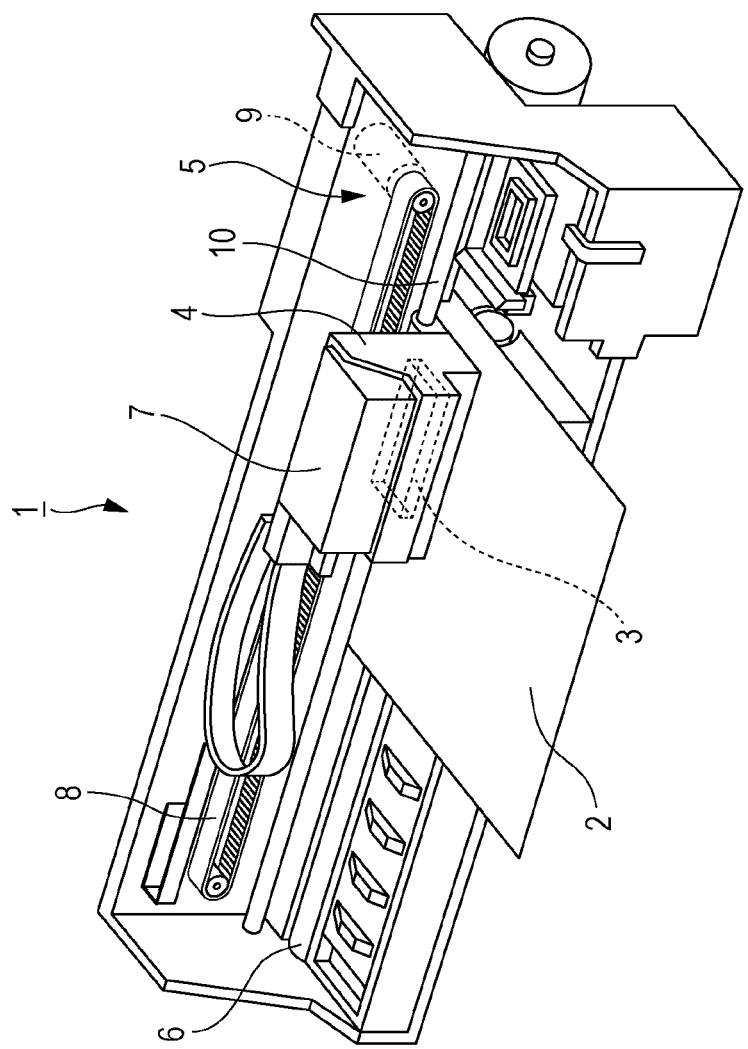
FIG. 1 is a perspective view illustrating a configuration of a printer.

Hereinafter, aspects for realizing the invention will be described with reference to the attached drawings. In the embodiments described below, although various limitations have been made as preferred specific examples of the invention, the scope of the invention is not limited to the aspects unless specifically stated to limit the invention in the following description. In addition, in the following description, a liquid ejecting head which is one category of a MEMS device, in particular, an ink jet type recording head (hereinafter recording head) 3, which is a type of liquid ejecting head, will be described as an example. FIG. 1 is a perspective view illustrating an ink jet printer (hereinafter, printer) 1 which is a kind of a liquid ejecting apparatus on which a recording head 3 is mounted.

The printer 1 is an apparatus that ejects ink (a type of liquid) onto a surface of a recording medium 2 (a kind of landing target) such as a recording paper and records an image or the like. The printer 1 includes a recording head 3, a carriage 4 to which the recording head 3 is attached, a carriage moving mechanism 5 which moves the carriage 4 in the main scanning direction, a transport mechanism 6 which transports the recording medium 2 in the sub scanning direction, and the like. Here, the ink is stored in the ink cartridge 7 as a liquid supply source. The ink cartridge 7 is detachably mounted on the recording head 3. A configuration in which the ink cartridge is disposed on the main body side of the printer and ink is supplied from the ink cartridge to the recording head through an ink supply tube can be adopted.

The carriage moving mechanism 5 includes a timing belt 8. The timing belt 8 is driven by a pulse motor 9 such as a DC motor. Therefore, when the pulse motor 9 is operated, the carriage 4 is guided by a guide rod 10 installed on the printer 1 and thus reciprocates in the main scanning direction (in width direction of recording medium 2). A position of the carriage 4 in the main scanning direction is detected by a linear encoder (not illustrated) which is a type of position information detecting means. The linear encoder transmits the detection signal thereof, that is, the encoder pulse (a kind of position information) to a control unit of the printer 1.

Figure 2:
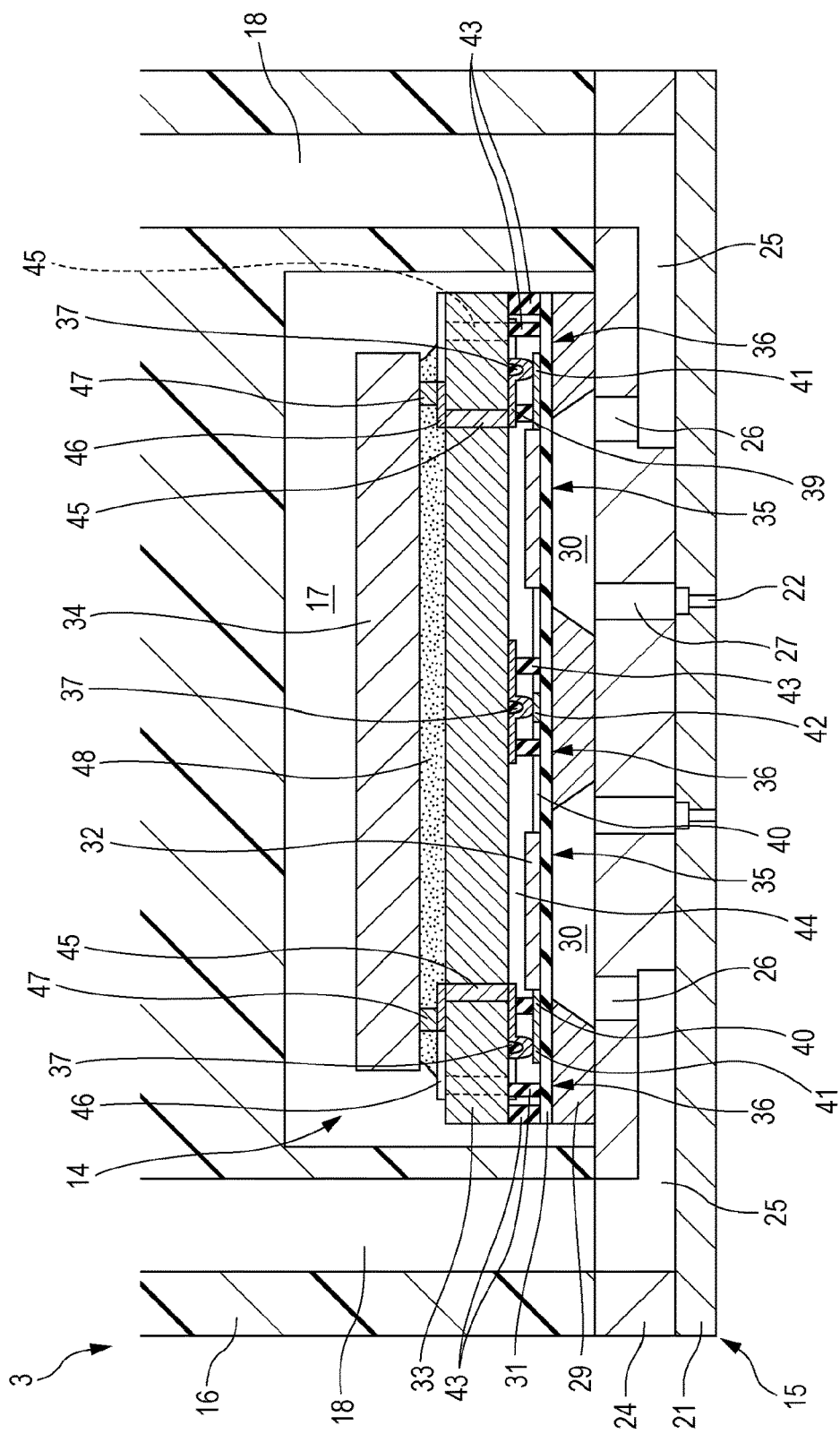
FIG. 2 is a cross-sectional view illustrating a configuration of a recording head.
Figure 3:
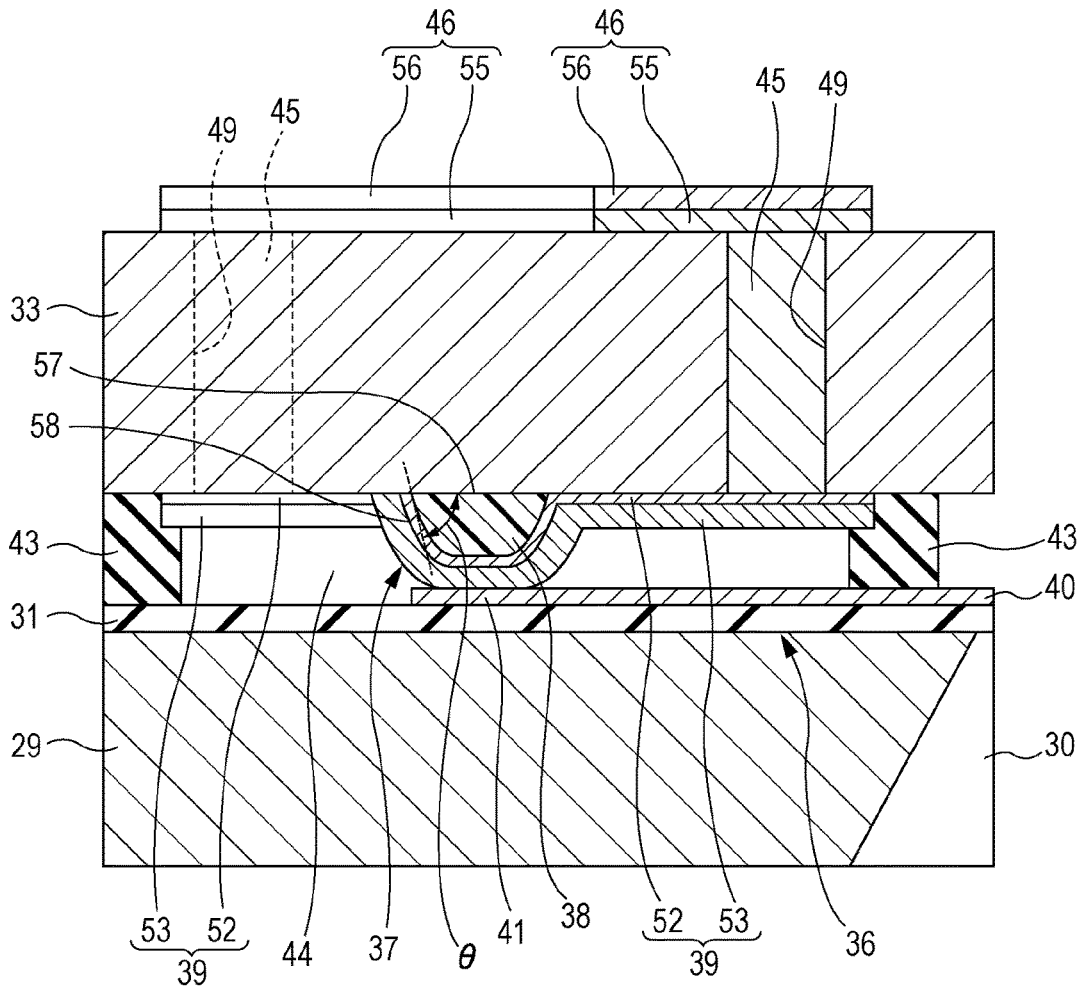
FIG. 3 is an enlarged sectional view illustrating a main portion of the recording head.

Next, the recording head 3 will be described. FIG. 2 is a cross-sectional view illustrating the configuration of the recording head 3. In addition, FIG. 3 is an enlarged sectional view of a main portion of the recording head 3. In other words, FIG. 3 is an enlarged sectional view of a periphery of the bump electrode 37 located at an end portion on a side of (left side in FIG. 2) of the recording head 3. In the following description, a laminating direction of each member is suitably described as a vertical direction. As illustrated in FIG. 2, the recording head 3 in the present embodiment is attached to a head case 16 in a state where an actuator unit 14 and a flow path unit 15 are laminated.

The head case 16 is a box-like member made of synthetic resin, and a liquid introduction path 18 which supplies ink to each pressure chamber 30 is formed inside the head case 16. The liquid introduction path 18 is space in which ink common to a plurality of pressure chambers 30 is stored along with a common liquid chamber 25 to be described below. In the present embodiment, two liquid introduction paths 18 are formed corresponding to the columns of pressure chambers 30 arranged in two columns in parallel. In addition, in a portion on the lower side of the head case 16 (side of flow path unit 15), a accommodation space 17 which is recessed in a rectangular parallelepiped shape from the lower surface of the head case 16 (surface of the flow path unit 15 side) to the middle of the head case 16 in the height direction is formed. When the flow path unit 15 to be described below is bonded in a state of being positioned on the lower surface of the head case 16, the actuator unit 14 (pressure chamber forming substrate 29, sealing plate 33, driving IC 34, or the like) laminated on a communication substrate 24 is configured to be accommodated in a accommodation space 17. Although not illustrated in the drawing, an opening which communicates the space outside the head case 16 and the accommodation space 17 with each other is formed in a portion of the ceiling surface of the accommodation space 17. A wiring substrate such as a flexible printed board (FPC) (not illustrated) is inserted through the opening into the accommodation space 17 and is connected to the actuator unit 14 in the accommodation space 17. Therefore, the accommodation space 17 is space opened to the atmosphere.

The flow path unit 15 in this embodiment includes the communication substrate 24 and a nozzle plate 21. The nozzle plate 21 is a substrate which is bonded to the lower surface (surface opposite to pressure chamber forming substrate 29) of the communication substrate 24 and is made of silicon. In the present embodiment, an opening on the lower surface side of space to be described below, which is the common liquid chamber 25, is sealed by the nozzle plate 21. In addition, a plurality of nozzles 22 are formed linearly (in a common) on the nozzle plate 21. Two columns of the nozzles 22 (that is, nozzle columns) which includes the plurality of nozzles 22 are formed in the nozzle plate 21. The nozzles 22 constituting each nozzle column are provided at a pitch corresponding to the dot formation density from the nozzle 22 of one end side to the nozzle 22 of the other end side, for example, at equal interval along the sub scanning direction. The nozzle plate 21 is bonded to a region that is deviated from the common liquid chamber 25 to the inside in the communication substrate 24 and the opening on the lower surface side of the space which becomes the common liquid chamber 25 can be sealed by a member such as a flexible compliance sheet.

The communication substrate 24 is a substrate which constitutes the upper portion (portion on head case 16 side) of the flow path unit 15 and is made of silicon. As illustrated in FIG. 2, a common liquid chamber 25 which communicates with the liquid introduction path 18 and stores ink common to the respective pressure chambers 30, an individual communication path 26 which separately supplies ink from the liquid introduction path 18 to each pressure chamber 30 via the common liquid chamber 25, and a nozzle communication path 27 which communicates the pressure chamber 30 and the nozzle 22 with each other are formed on the communication substrate 24 by etching or the like. A plurality of individual communication paths 26 and a plurality of nozzle communication paths 27 are formed along the nozzle column direction. In addition, the common liquid chamber 25 is an elongated empty portion along the direction of the nozzle column, and as illustrated in FIG. 2, it is formed in two columns corresponding to the columns of the pressure chambers 30 arranged in two columns in parallel.

As illustrated in FIG. 2, the actuator unit 14 in the present embodiment is bonded to the communication substrate 24 in a state where a pressure chamber forming substrate 29, a vibration plate 31, a piezoelectric element 32 which is a type of actuator, a sealing plate 33, and a driving IC 34 are laminated to be a unit. The actuator unit 14 is formed to be smaller than the accommodation space 17 so as to be capable of being accommodated in the accommodation space 17.

The pressure chamber forming substrate 29 is a substrate made of silicon which constitutes a lower portion (portion on flow path unit 15 side) of the actuator unit 14. A plurality of spaces serving as the pressure chambers 30 are arranged in parallel along the nozzle column direction by a portion of the pressure chamber forming substrate 29 being removed in a plate thickness direction by etching or the like. A lower side of the space is defined by the communication substrate 24 and an upper side thereof is defined by the vibration plate 31 to constitute the pressure chamber 30. In addition, this space, that is, the pressure chamber 30 is formed in two columns corresponding to the nozzle columns formed in two columns. Each of the pressure chambers 30 is an empty portion elongated in a direction orthogonal to the nozzle column direction, the individual communication path 26, communicates with an end portion on a side, and the nozzle communication path 27 communicates with an end portion on the other side thereof in the longitudinal direction.

The vibration plate 31 is an elastic thin film substrate and is laminated on the upper surface (surface opposite to flow path unit 15 side) of the pressure chamber forming substrate 29. An upper opening of the space serving as the pressure chamber 30 is sealed by the vibration plate 31. In other words, the pressure chamber 30 is defined by the vibration plate 31. A portion of the vibration plate 31 corresponding to the pressure chamber 30 (specifically, upper opening of pressure chamber 30) functions as a displacement portion that is displaced in a direction away from or close to the nozzle 22 in accordance with flexural deformation of the piezoelectric element 32. In other words, a region of the vibration plate 31 corresponding to the upper opening of the pressure chamber 30 becomes a driving region 35 in which the flexural deformation is permitted. On the other hand, a region of the vibration plate 31 deviated from the upper opening of the pressure chamber 30 becomes a non-driving region 36 where flexural deformation is inhibited. A substrate including the pressure chamber forming substrate 29 on which the vibrating plate 31 is laminated, that is, the vibrating plate 31 and the pressure chamber forming substrate 29 corresponds to the second substrate in the invention.

In addition, the vibration plate 31 includes, for example, an elastic film which is made of silicon dioxide ($SiO_2$) formed on an upper surface of the pressure chamber forming substrate 29 and an insulating film which is made of zirconium oxide ($ZrO_2$) formed on the elastic film. Piezoelectric elements 32 are laminated on a region corresponding to the respective pressure chambers 30 on the insulating film (surface on side opposite to pressure chamber forming substrate 29 side of vibration plate 31), that is, the driving region 35. The piezoelectric element 32 in the present embodiment is a so-called flexural mode of piezoelectric element. The piezoelectric element 32 is formed by a lower electrode layer, a piezoelectric layer, and an upper electrode layer, for example, on the vibration plate 31 being sequentially laminated. Any one of the upper electrode layer or the lower electrode layer becomes a common electrode formed commonly on the respective piezoelectric elements 32 and the other thereof becomes an individual electrode individually formed on each piezoelectric element 32. When an electric field corresponding to potential difference between the lower electrode layer and the upper electrode layer is applied between the lower electrode layer and the upper electrode layer, the piezoelectric element 32 deforms to be flexural in a direction away from or close to the nozzle 22. The piezoelectric elements 32 in the present embodiment are formed in two columns along the nozzle column direction corresponding to the pressure chambers 30 arranged in two columns in parallel along the nozzle column direction.

In addition, as illustrated in FIG. 2 and FIG. 3, a wiring 40 connected to the individual electrode or the common electrode of the piezoelectric element 32 is formed on the vibration plate 31. The wiring 40 extends to the non-driving region 36 of the vibration plate 31 and serves as a terminal to be connected to the bump electrode 37 (to be described below) in the non-driving region 36. In other words, as illustrated in FIG. 2, an individual terminal 41 (a kind of terminal in the invention) connected to the individual electrode of the piezoelectric element 32 and a common terminal 42 (a kind of terminal in the invention) connected to the common electrode of the piezoelectric element 32 are formed in the non-driving region 36 on the upper surface (surface facing sealing plate 33) of the vibration plate 31. Specifically, in a direction orthogonal to the nozzle column direction, the individual terminals 41 are formed on the outside of the column of one piezoelectric element 32 and the outside of the column of the other piezoelectric element 32 and the common terminal 42 is formed between columns of both piezoelectric elements 32. Since the individual terminal 41 is connected to the individual electrode of the piezoelectric element 32, the individual terminal 41 is formed for each piezoelectric element 32. In other words, a plurality of individual terminals 41 are formed along the nozzle column direction. On the other hand, since the common terminal 42 is connected to the common electrode of the piezoelectric element 32, at least one common terminal 42 is formed. In the present embodiment, the common terminal 42 is connected to both the common electrode on the column of one piezoelectric element 32 and the common electrode on the column of the other piezoelectric element 32.

As illustrated in FIG. 2 and FIG. 3, the sealing plate 33 (corresponding to first substrate in the invention) is a substrate made of silicon which is placed with an interval from the vibration plate 31 in a state where a photosensitive adhesive 43 (corresponding to interposed member in the invention) having insulating properties is interposed between the vibration plate 31 and the sealing plate 33. In this embodiment, a plurality of bump electrodes 37 which output a driving signal from the driving IC 34 to the piezoelectric element 32 side are formed on the lower surface (corresponding to second surface in the invention) which is a surface of the sealing plate 33 on the side of the pressure chamber forming substrate 29. As illustrated in FIG. 2, the bump electrode 37 is formed at a position corresponding to one individual terminal 41 formed on the outside of one piezoelectric element 32, a position corresponding to the other individual terminal 41 formed outside the other piezoelectric element 32, a position corresponding to the common terminal 42 formed between the columns of the piezoelectric elements 32, and the like. Each bump electrode 37 is connected to a corresponding individual terminal 41 or common terminal 42, respectively. The sealing plate 33 and the pressure chamber forming substrate 29 are bonded in a state of being pressed in an approaching direction to each other so that the bump electrodes 37, the individual terminals 41 corresponding thereto and the common terminal 42 are electrically connected in a reliable manner.

As illustrated in FIG. 3, the bump electrode 37 in the present embodiment is a so-called resin core bump which includes a protrusion portion 38 made of resin protruding from the lower surface of the sealing plate 33 and a conductive film 39 which covers a portion of a surface (specifically, surface opposite to surface which is in contact with lower surface of sealing plate 33) of the protrusion portion 38. The protrusion portion 38 is made of, for example, a resin having elasticity made of polyimide resin, phenol resin, epoxy resin, or the like and is formed as a protrusion along the nozzle column direction on the lower surface of the sealing plate 33. In addition, as illustrated in FIG. 3, in the cross-section in the direction intersecting the nozzle column direction, the protrusion portion 38 has a lower surface formed in a circular arc shape. In other words, the protrusion portion 38 has a first resin surface 57 which extends along the lower surface of the sealing plate 33 and is in contact with the sealing plate 33 and a second resin surface 58 having a circular arc shape rising in a crossing direction with respect to a lower surface of the sealing plate 33 from both ends of the surface. In the cross section in a direction intersecting the nozzle column direction (that is, extending direction of conductive film 39), the rising angle θ of the end portion of the second resin surface 58 having a circular arc shape, in other words, an inner angle θ at the intersection point between the first resin surface 57 and the second resin surface 58 is set to 90 degrees or less. In the present embodiment, the angle θ is set to 60 degrees to 80 degrees.

In addition, the conductive film 39 is formed by laminating a lower surface side protective film 52 (corresponding to second protective film in the invention) and a lower surface side metal film 53 in this order from the lower surface side of the sealing plate 33. The lower surface side protective film 52 is made of, for example, titanium (Ti), nickel (Ni), chromium (Cr), tungsten (W), alloys thereof, laminated thereof, or the like, and has corrosion resistance and conductivity. In addition, the lower surface side metal film 53 is made of gold (Au) or the like. Therefore, the lower surface side protective film 52 functions not only as a protective film for protecting the through wiring 45 to be described below but also as an adhesive layer for increasing the adhesion of the lower surface side metal film 53. In addition, the lower surface side protective film 52 can also function as a barrier layer for suppressing metal diffusion occurring between the lower surface side metal film 53 and the through wiring 45. By suppressing metal diffusion, fluctuation in resistance value can be reduced and thus reliability can be improved. In the present embodiment, the film thickness of the lower surface side protective film 52 is thinner than that of the upper surface side protective film 55 to be described below and is formed to be, for example, 50 nm to 150 nm. In addition, the film thickness of the lower surface side metal film 53 is formed to be substantially the same as that of the upper surface side metal film 56 to be described below, and is formed to be, for example, 400 nm to 600 nm.

The two-layered conductive film 39 described above is formed at a position corresponding to the individual terminal 41 or the common terminal 42 on the surface of the protrusion portion 38. Specifically, a plurality of conductive films 39 of the bump electrodes 37 electrically connected to the individual terminals 41 are formed along the nozzle column direction corresponding to the individual terminals 41 arranged in parallel along the nozzle column direction. In addition, at least one conductive film 39 electrically connected to the common terminal 42 is formed corresponding to the common terminal 42. The protrusion portions 38 are connected to the individual terminal 41 or the common terminal 42 in a slightly collapsed state in the height direction with the conductive film 39 (lower surface side protective film 52 and lower surface side metal film 53) interposed therebetween. In other words, the bump electrode 37 is connected to the individual terminal 41 or the common terminal 42 in a slightly collapsed state in the height direction.

In addition, as illustrated in FIG. 3, the conductive film 39 extends to position overlapping the through wiring 45 (corresponding to wiring in the invention) formed at a position different from the protrusion portion 38 on the lower surface of the sealing plate 33 along a direction intersecting the nozzle column direction. In other words, the conductive film 39 extends from a position overlapping the end portion on the lower surface side of the through wiring 45 to a position overlapping the protrusion portion 38 in a direction intersecting the nozzle column direction. An end portion on the lower surface side of the through wiring 45 is covered with the conductive film 39 (that is, lower surface side protective film 52) and thus is electrically connected to the conductive film 39. In the present embodiment, since the through wiring 45 formed on one side of the bump electrode 37 and the through wiring 45 formed on the other side of the bump electrode 37 are disposed alternately along the nozzle column direction, the conductive film 39 taken out from the position overlapping the protrusion portion 38 to one side and the conductive film 39 taken out from the position overlapping the protrusion portion 38 to the other side or the position overlapping with the protrusion portion 38 are disposed alternately along the nozzle column direction.

As illustrated in FIG. 2 and FIG. 3, the through wiring 45 is a wiring relaying between the lower surface and the upper surface of the sealing plate 33, that is, a wiring extending from the lower surface side to the upper surface side of the sealing plate 33 and is made of a metal (conductor) such as copper (Cu) formed in an inside portion of the through hole 49 passing through the sealing plate 33 in the plate thickness direction. The through hole 49 in this embodiment is formed at a position corresponding to a sealing space 44 (to be described below) formed between the pressure chamber forming substrate 29 and the sealing plate 33. In other words, the through wiring 45 is disposed so that the end (end portion) on the lower surface side thereof faces the inside of the sealing space 44. As described above, the portion (that is, end on lower surface side of through wiring 45) of the through wiring 45 exposed at the opening portion on the lower surface side of the through hole 49 is covered by the corresponding conductive film 39. On the other hand, the portion (that is, end (end portion) on the upper surface side of the through wiring 45) of the through wiring 45 exposed at the opening portion on the upper surface side of the through hole 49 is covered by the corresponding upper surface side wiring 46. The conductive film 39 extending from the bump electrode 37 and the upper surface side wiring 46 are electrically connected by the through wiring 45. The through wiring 45 need not be filled in the through hole 49, and it is sufficient if at least a portion of the through hole 49 extends from the upper surface of the sealing plate 33 to the lower surface of the sealing plate 33.

The upper surface side wiring 46 is a wiring which is laminated on the upper surface (corresponding to first surface in the invention) which is a surface of the sealing plate 33 on the driving IC 34 side (side opposite to pressure chamber forming substrate 29 side). The upper surface side wiring 46 is formed by laminating an upper surface side protective film 55 (corresponding to first protective film in the invention) and an upper surface side metal film 56 in this order from the upper surface side of the sealing plate 33. The upper surface side protective film 55 is made of the same metal as that of the lower surface side protective film 52 and is made of, for example, titanium (Ti), nickel (Ni), chromium (Cr), tungsten (W), alloys thereof, laminated thereof, and the like. Therefore, like the lower surface side protective film 52, the upper surface side protective film 55 also has corrosion resistance and conductivity. In addition, the upper surface side metal film 56 is made of the same metal as the lower surface side metal film 53 and is made of gold (Au) or the like. Like the lower surface side metal film 53, the upper surface side protective film 55 functions not only as a protective film for protecting the through wiring 45 but also as an adhesive layer for increasing the adhesion of the upper surface side metal film 56. In addition, the upper surface side protective film 55 can also function as a barrier layer for suppressing metal diffusion occurring between the upper surface side metal film 56 and the through wiring 45. By suppressing metal diffusion, fluctuation in resistance value can be reduced and reliability can be improved. The film thickness of the upper surface side protective film 55 in the present embodiment is larger than the film thickness of the lower surface side protective film 52, and is formed to be, for example, 250 nm to 350 nm. In addition, as described above, the film thickness of the upper surface side metal film 56 is formed to be substantially the same as the film thickness of the lower surface side metal film 53, and is formed to be, for example, 400 nm to 600 nm. The upper surface side wiring 46 extends from a position covering the end portion on the upper surface side of the through wiring 45 to a position corresponding to the IC terminal 47 of the driving IC 34 to be described below and becomes a terminal portion connected to the IC terminal 47 at that position.

The photosensitive adhesive 43 for adhering the sealing plate 33 and the pressure chamber forming substrate 29 (more specifically, vibration plate 31 laminated on pressure chamber forming substrate 29) to each other is an adhesive that has photosensitivity in which the degree of curing changes by light irradiation and a thermosetting property in which degree of curing changes by heating. As the photosensitive adhesive 43 described above, for example, a resin including an epoxy resin, an acrylic resin, a phenol resin, a polyimide resin, a silicone resin, a styrene resin or the like as a main component is suitably used. In addition, as illustrated in FIG. 2, the photosensitive adhesive 43 in the present embodiment is provided on the outer peripheral portion of the sealing plate 33 and on both sides of the bump electrode 37 in the direction orthogonal to the nozzle column direction. A sealing space 44 (a kind of space in the invention) is formed between the sealing plate 33 and the pressure chamber forming substrate 29 by the photosensitive adhesive 43 provided on the outer peripheral portion of the sealing plate 33. In other words, the sealing space 44 is defined by the photosensitive adhesive 43 provided on the sealing plate 33, the pressure chamber forming substrate 29 (vibration plate 31), and the outer peripheral portion of the sealing plate 33. Therefore, the piezoelectric element 32 is accommodated in the sealing space 44. Since the sealing space 44 is open to the atmosphere via an atmospheric release path (not illustrated) having a small diameter passing through the sealing plate 33, the sealing space is not a completely sealing space. In addition, the photosensitive adhesive 43 provided on both sides of the bump electrode 37 is formed to be long along the extending direction of the protrusion portion 38, respectively.

The driving IC 34 is laminated on the upper surface of the sealing plate 33. The driving IC 34 is an IC chip for driving the piezoelectric element 32, and is fixed to the upper surface of the sealing plate 33 via an adhesive 48 such as an anisotropic conductive film (ACF). As illustrated in FIG. 2, a plurality of IC terminals 47 connected to terminal portions of the upper surface side wiring 46 are formed on the lower surface (surface on sealing plate 33 side) of the driving IC 34. A plurality of IC terminals 47 corresponding to the individual terminals 41 of the IC terminals 47 is arranged in parallel along the nozzle column direction. In the present embodiment, two columns of IC terminals 47 are formed corresponding to the columns of piezoelectric elements 32 arranged in two columns in parallel.

The recording head 3 having the configuration described above introduces the ink from the ink cartridge 7 into the pressure chamber 30 via the liquid introduction path 18, the common liquid chamber 25, the individual communication path 26, and the like. In this state, when a drive signal from the driving IC 34 is supplied to the piezoelectric element 32 via the bump electrode 37 or the like, the piezoelectric element 32 is driven to cause pressure variation in the ink in the pressure chamber 30. By using this pressure fluctuation, the recording head 3 ejects ink droplets from the nozzles 22.

Figure 4:
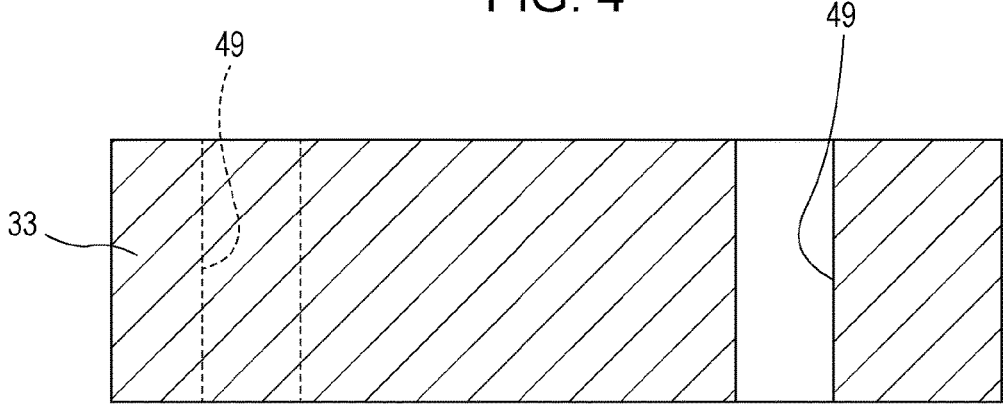
FIG. 4 is a state transition diagram illustrating a method for manufacturing a sealing plate.
Figure 5:
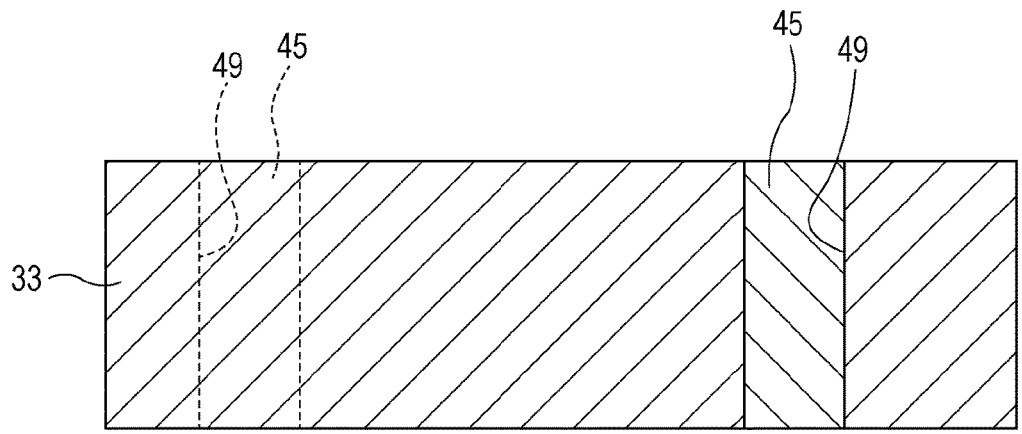
FIG. 5 is a state transition diagram illustrating the method for manufacturing a sealing plate.

Next, the method for manufacturing a recording head 3, particularly a method for manufacturing a sealing plate 33, will be described in detail. FIG. 4 to FIG. 7 are state transition diagrams for illustrating the method for manufacturing a sealing plate 33. First, as illustrated in FIG. 4, a through hole 49 passing through the sealing plate 33 in the thickness direction is formed at a predetermined position of a silicon substrate (hereinafter, simply referred to as sealing plate 33) which becomes the sealing plate 33. The a through hole 49 described above is formed by, for example, dry etching, wet etching, laser, a method combining these methods, or the like. Once the through hole 49 is formed in the sealing plate 33, the through wiring 45 is formed in the inside portion of the through hole 49 by an electrolytic plating method or the like. Specifically, for example, a seed layer is formed in the inside portion of the through hole 49 by a sputtering method or the like, and metal is grown on the seed layer by the electrolytic plating method, and the inside of the through hole 49 is filled with metal. The metal precipitated outside the upper surface or the lower surface of the sealing plate 33 is removed by a chemical mechanical polishing (CMP) method or the like. Accordingly, the through wiring 45 is formed as illustrated in FIG. 5.

Figure 6:
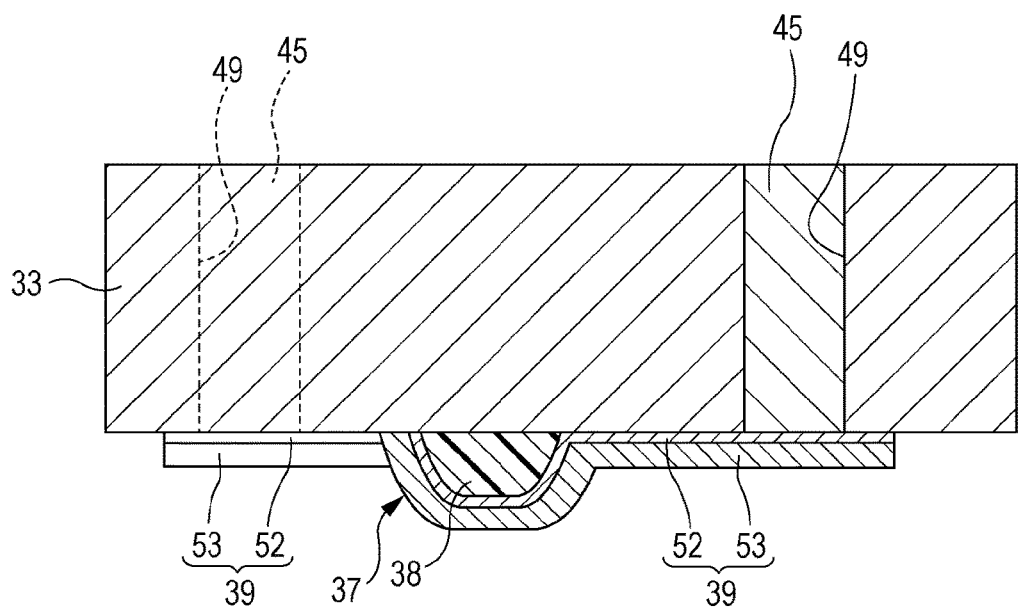
FIG. 6 is a state transition diagram illustrating the method for manufacturing a sealing plate.

Next, a bump electrode 37 is formed on the lower surface of the sealing plate 33. Specifically, for example, a resin layer is formed on the surface of the sealing plate 33, and a resin layer is formed at a predetermined position via a photolithography process or the like. In other words, a resin layer having a rectangular-shaped cross section and extending along the nozzle column direction is formed. Once the resin layer described above is formed, the sealing plate 33 is heated. The viscosity of the resin layer is decreased by the heating and the corner is formed. Thereafter, the resin layer is solidified by the sealing plate 33 being cooled. As a result, as illustrated in FIG. 6, a protrusion portion 38 having a circular arc surface is formed. Next, a conductive film 39 is formed on the protrusion portion 38. Specifically, first, a metal layer which becomes the lower surface side protective film 52 is formed on the entire lower surface of the sealing plate 33 to a thickness of, for example, 50 nm to 150 nm, and the metal layer which becomes the lower surface side metal film 53 is formed thereon to a thickness of, for example, 400 nm to 600 nm. Thereafter, a resist layer is formed on the metal layer which becomes the lower surface side metal film 53, and a metal layer which becomes the lower surface side protective film 52 and a metal layer which becomes the lower surface side metal film 53 are etched via a photolithography process, an etching process, or the like. Accordingly, as illustrated in FIG. 6, the conductive film 39 (lower surface side protective film 52 and lower surface side metal film 53) is formed at a predetermined position, and the bump electrode 37 is formed.

Figure 7:
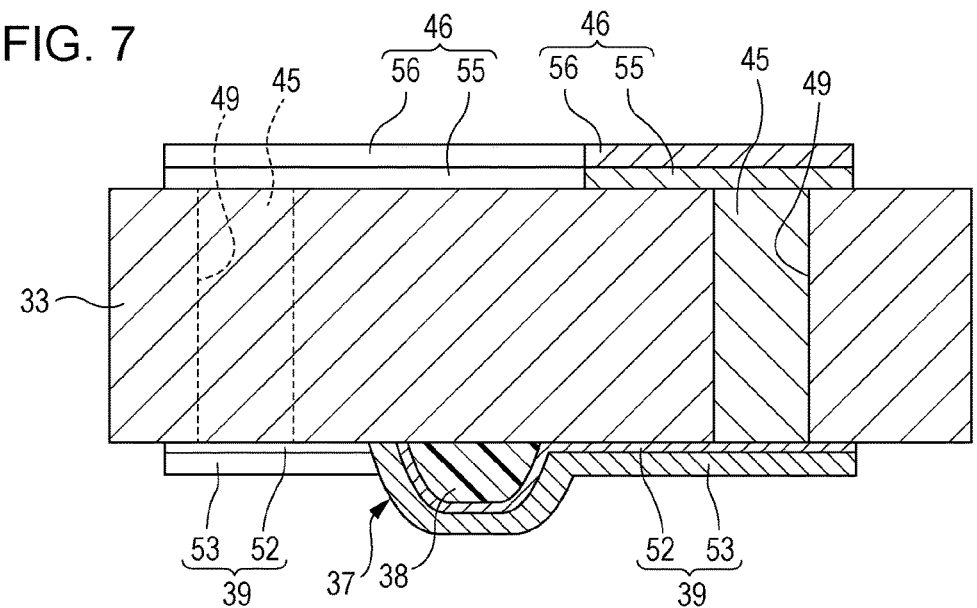
FIG. 7 is a state transition diagram illustrating the method for manufacturing a sealing plate.

Finally, the upper surface side wiring 46 and the like are formed on the upper surface of the sealing plate 33. Specifically, a metal layer which becomes the upper surface side protective film 55 is formed on the entire upper surface of the sealing plate 33 to a thickness of, for example, 250 nm to 350 nm, and a metal layer which becomes the upper surface side metal film 56 is formed thereon to a thickness of, for example, 400 nm to 600 nm. Thereafter, a resist layer is formed on the metal layer which becomes the upper surface side metal film 56, and a metal layer which becomes the upper surface side protective film 55 and a metal layer which becomes the upper surface side metal film 56 are etched via a photolithography process, an etching process, or the like. Accordingly, as illustrated in FIG. 7, the upper surface side wiring 46 (upper surface side protective film 55 and upper surface side metal film 56) is formed at a predetermined position, and the sealing plate 33 is created. The method for manufacturing the sealing plate 33 is not limited to the above method. For example, first, the upper surface side wiring 46 and the like may be formed on the upper surface of the sealing plate 33 and the bump electrodes 37 and the like may be formed on the lower surface of the sealing plate 33 later.

Once the sealing plate 33 is formed, the photosensitive adhesive 43 before curing is interposed between the pressure chamber forming substrate 29 and the sealing plate 33 and then the pressure chamber forming substrate 29 on which the vibration plate 31 and the like are formed and the sealing plate 33, are pressed (pressurized) in the approaching direction to each other. In this state, by heating, the photosensitive adhesive 43 is cured to bond the pressure chamber forming substrate 29 and the sealing plate 33 to each other. Thereafter, the driving IC 34 is bonded to the sealing plate 33 and then the actuator unit 14 is created. After the actuator unit 14 and the flow path unit 15 are bonded to each other, the flow path unit 15 to which the actuator unit 14 is bonded is bonded to the lower surface of the head case 16. Accordingly, the actuator unit 14 is accommodated in the accommodation space 17, and thus the recording head 3 described above is created.

In this manner, since the film thickness of the lower surface side protective film 52 is made relatively thin, the film forming time of the metal layer which becomes the lower surface side protective film 52 can be shorten. In other words, the time for forming the lower surface side protective film 52 can be shortened and the productivity of the recording head 3, eventually the printer 1, can be improved. In addition, since the thickness of the lower surface side protective film 52 is decreased, the cost for forming the lower surface side protective film 52 can be suppressed and the manufacturing cost of the recording head 3, eventually the printer 1, can be suppressed. In this manner, even if the thickness of the lower surface side protective film 52 is decreased, since the end portion on the lower surface side of the through wiring 45 faces the sealing space 44, corrosion of the end portion on the lower surface side of the through wiring 45 can be suppressed. In other words, since the end portion on the lower surface side of the through wiring 45 is sealed in the sealing space 44 and is spaced apart from the environment outside the actuator unit 14, the end portion on the lower surface side of the through wiring 45 is unlikely to be corroded. In addition, in the present embodiment, since the end portion on the lower surface side of the through wiring 45 is covered with the lower surface side protective film 52, as compared with a case where the end portion on the lower surface side of the through wiring 45 is not covered with a protective film, corrosion resistance of the through wiring 45 can be improved. On the other hand, since the end portion on the upper surface side of the through wiring 45 is covered with the upper surface side protective film 55 having a relatively large film thickness, the end portion on the upper surface side of the through wiring 45 is unlikely to be corroded. As a result, the reliability of the recording head 3 can be improved.

Further, since the lower surface side protective film 52 extends from a position covering the end portion on the lower surface side of the through wiring 45 to the position overlapping the protrusion portion 38, the lower surface side protective film 52 can function as a portion of an electrode (bump electrode) which is connected to the individual terminal 41 or the common terminal 42. Since the film thickness of the lower surface side protective film 52 is formed to be thinner than that of the upper surface side protective film 55, when being electrically connected by pressing the bump electrode 37 against the terminal, cracking and fracturing is unlikely to be generated in the lower surface side protective film 52. As a result, the reliability of the connection between the lower surface side protective film 52 which becomes the bump electrode 37 and the individual terminal 41 or the common terminal 42 can be improved. Further, in the extending direction of the lower surface side protective film 52, since the inner angle θ at the intersection point between the first resin surface 57 of the protrusion portion 38 extending along the lower surface of the sealing plate 33 and the second resin surface 58 of the protrusion portion 38 extending in the direction intersecting the lower surface of the sealing plate 33 is set to 90 degrees or less, the lower surface side protective film 52 extending from the lower surface of the sealing plate 33 to a position overlapping the protrusion portion 38 can be prevented from being disconnected at a boundary between the lower surface of the sealing plate 33 and the protrusion portion 38. In particular, in the present embodiment, since the inner angle θ described above is set to 60 degrees to 80 degrees, even when the film thickness of the lower surface side protective film 52 is made relatively thin, disconnection of the lower surface side protective film 52 can be further suppressed.

Figure 8:
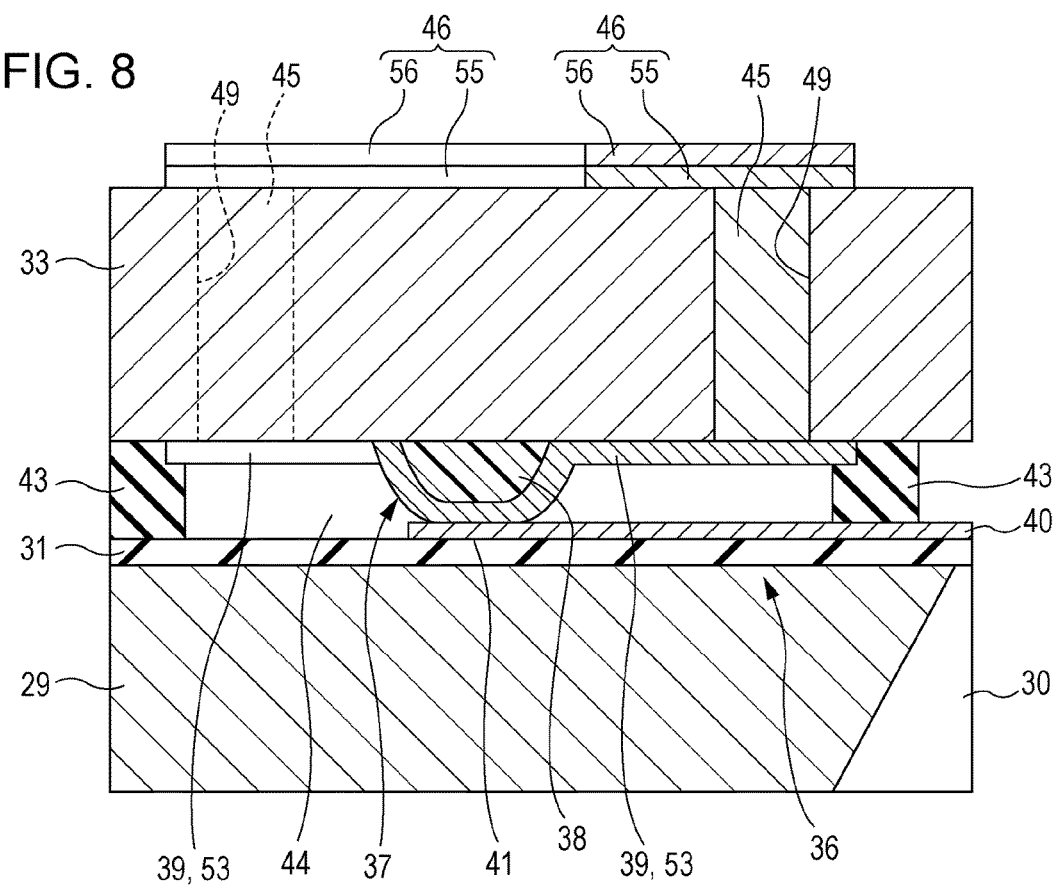
FIG. 8 is an enlarged sectional view illustrating a main portion of a recording head according to a second embodiment.

By the way, in the embodiment described above, although the end portion on the lower surface side of the through wiring 45 is covered with the lower surface side protective film 52, it is not limited thereto. For example, in the second embodiment illustrated in FIG. 8, the lower surface side protective film 52 is not formed on the lower surface of the sealing plate 33. In other words, as illustrated in FIG. 8, the conductive film 39 includes only the lower surface side metal film 53. In this manner, by eliminating the lower surface side protective film, a process of forming the lower surface side protective film is not required and thus it is possible to further improve the productivity of the recording head 3. In addition, the manufacturing cost of the recording head 3 can be further suppressed. Further, there are no problems such as cracking and fracturing of the lower surface side protective film when electrically connecting by pressing the bump electrode 37 against the terminal. As a result, the reliability of the connection between the bump electrode 37 and the individual terminal 41 or the common terminal 42 can be further improved. In this manner, even when the lower surface side protective film is eliminated, since the end portion on the lower surface side of the through wiring 45 faces the sealing space 44, corrosion of the end portion on the lower surface side of the through wiring 45 can be suppressed. Since the other configuration, that is, the configuration except that the lower surface side protective film is not provided and the conductive film 39 is made one layer is the same as the first embodiment described above, the description thereof is omitted.

In addition, in the above description, as an explanation of the configuration of the bump electrode 37, or the like, although the bump electrode 37 connected to one individual terminal 41 of the plurality of bump electrodes 37 mainly described, since the configuration of other bump electrodes 37 (the other bump electrode 37 connected to the individual terminal 41, since the bump electrode 37 connected to the common terminal 42 and the like) or the like are substantially the same as the bump electrode 37 connected to one the individual terminals 41, the description is omitted. Further, each embodiment described above, although the photosensitive adhesive 43 is described as a interposed member which defines the sealing space 44 between the sealing plate 33 and the pressure chamber forming substrate 29, as an example, it is not limited thereto. The interposed member may be of any type as long as it can define the sealing space between the sealing plate and the pressure chamber forming substrate. For example, a hollow member (substrate) in which the upper surface is bonded to the sealing plate and the lower surface is bonded to the pressure chamber forming substrate may be used between the sealing plate and the pressure chamber forming substrate.

In the above embodiment, although the ink jet type recording head 3 is described as an example of the liquid ejecting head, the invention can be also applied to other liquid ejecting heads. The invention can be applied to a color material ejecting head which is used for manufacturing a color filter of a liquid crystal display or the like, an electrode material ejecting head which is used for forming an electrode of an organic Electro Luminescence (EL) display, a face emitting display (FED), or the like, a bioorganic ejecting head which is used for manufacturing a biochip (biochemical element), or the like, for example. A solution of each color material of red (R), green (G), and blue (B) is ejected as a kind of liquid from a color material ejecting head for the display manufacturing apparatus. In addition, a liquid electrode material is injected as a kind of liquid from the electrode material ejecting head for an electrode forming apparatus, and a solution of bioorganic matter is ejected as a kind of liquid from the bioorganic ejecting head for a chip manufacturing apparatus.

In addition, the invention can be applied to a MEMS device having a structure in which a first substrate and a second substrate are bonded to each other with interval there between. For example, the invention can be also applied to a MEMS device including a driving region and a piezoelectric element on any one of a first substrate and a second substrate, and applying the piezoelectric element to a sensor or the like for detecting pressure change, vibration, displacement, or the like of a driving region.

The entire disclosure of Japanese Patent Application No. 2016-183925, filed Sep. 21, 2016 is expressly incorporated by reference herein.

What is claimed is:
1. A MEMS device comprising:
a first substrate;
a second substrate which is disposed with an interval from the first substrate; and
an interposed member which is interposed between the first substrate and the second substrate,
wherein the MEMS device has space which is defined by the first substrate, the second substrate, and the interposed member,
wherein the first substrate includes a wiring which extends from a first surface side which is a surface on a side opposite to the second substrate side toward a second surface side which is a surface of the second substrate side and is made of a conductor,
wherein an end portion of the first surface side of the wiring is covered by a first protective film provided on the first surface side,
wherein an end portion of the second surface side of the wiring faces the space, wherein the end portion of the second surface side of the wiring is covered by a second protective film provided on the second surface side, wherein a film thickness of the second protective film is thinner than that of the first protective film, wherein the second protective film has conductivity, wherein a protrusion portion which protrudes from the second surface and is made of resin is formed, wherein the second protective film extends from a position covering the end portion of the second surface side of the wiring to a position overlapping the projection portion, and wherein the protrusion portion is connected to a terminal formed on the second substrate with the protective film interposed between the protrusion portion and the terminal.

2. The MEMS device according to claim 1, wherein the protrusion portion includes a first resin surface which is a surface along the second surface, and a second resin surface which is a surface provided so as to intersect the second surface, and wherein an inner angle at an intersection point between the first resin surface of the protrusion portion and the second resin surface of the protrusion portion is 90 degrees or less in the extending direction of the second protective film.

3. A liquid ejecting head comprising:

a nozzle for ejecting liquid; and a structure of the MEMS device according to claim 1.

4. A liquid ejecting apparatus comprising:

the liquid ejecting head according to claim 3.

* * * * *